(12) United States Patent
Kishi et al.

(10) Patent No.: US 12,095,225 B2
(45) Date of Patent: Sep. 17, 2024

(54) DML DRIVER

(71) Applicant: Nippon Telegraph and Telephone Corporation, Tokyo (JP)

(72) Inventors: Toshiki Kishi, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 642 days.

(21) Appl. No.: 17/431,071

(22) PCT Filed: Mar. 12, 2020

(86) PCT No.: PCT/JP2020/010768
§ 371 (c)(1),
(2) Date: Aug. 13, 2021

(87) PCT Pub. No.: WO2020/195886
PCT Pub. Date: Oct. 1, 2020

(65) Prior Publication Data
US 2022/0059987 A1    Feb. 24, 2022

(30) Foreign Application Priority Data

Mar. 26, 2019    (JP) ................................ 2019-058142

(51) Int. Cl.
*H01S 5/042*     (2006.01)
*H01S 5/062*     (2006.01)

(52) U.S. Cl.
CPC ........ *H01S 5/0427* (2013.01); *H01S 5/06213* (2013.01); *H01S 5/06226* (2013.01)

(58) Field of Classification Search
CPC ............... H01S 5/0427; H01S 5/06213; H01S 5/06226; H05B 45/30
See application file for complete search history.

(56) References Cited

U.S. PATENT DOCUMENTS

| | | | |
|---|---|---|---|
| 8,571,079 B1* | 10/2013 | Nguyen ................ | H01S 5/0683 372/38.07 |
| 2010/0092184 A1* | 4/2010 | Nguyen ........... | H04B 10/25891 398/192 |
| 2014/0233594 A1* | 8/2014 | Kubo .................... | H01S 5/0428 372/29.012 |
| 2014/0294026 A1* | 10/2014 | Yang .................... | H04B 10/504 372/38.02 |
| 2016/0141833 A1* | 5/2016 | Moto .................... | H01S 5/0428 372/38.02 |

OTHER PUBLICATIONS

Moto et al., "A Low Power Quad 25.78-Gbit/s 2.5 V Laser Diode Driver Using Shunt-Driving in 0.18 μm SiGe—BiCMOS," IEEE, 2013, 4 pages.

* cited by examiner

Primary Examiner — Michael Carter
(74) Attorney, Agent, or Firm — Slater Matsil, LLP

(57) ABSTRACT

The DML driver includes: a post driver which supplies a driving current to the LD; and a pre-driver which drives the post driver in response to a modulated signal. The pre-driver has a transistor, a peaking inductor, a peaking inductor, a group delay inhibition inductor, and a peaking capacitor.

8 Claims, 9 Drawing Sheets

DML DRIVER

CROSS-REFERENCE TO RELATED APPLICATIONS

This application is a national phase entry of PCT Application No. PCT/JP2020/010768, filed on Mar. 12, 2020, which claims priority to Japanese Application No. 2019-058142 filed on Mar. 26, 2019, which applications are hereby incorporated herein by reference.

TECHNICAL FIELD

The present invention relates to a DML driver which drives a directly modulated laser (DML).

BACKGROUND

In recent years, owing to marked development of social networking service (SNS), a traffic volume of communications all over the world has been increasing year after year. From now on, owing to development of Internet of things (Iot) and cloud computing technology, a further increase in the traffic volume has been anticipated, and in order to support an enormous traffic volume, enlarging a communication capacity inside and outside a data center has been demanded. In accordance with the enlargement of the capacity, standardization of standards of 10 GbE and 40 GbE of Ethernet (a registered trademark) which is a main standard constituent of a network has been presently completed, and standardization of 100 GbE which aims further enlargement of the capacity is going to be nearly completed. For the purpose of application to the 100 GbE, from a view point of a reduction in power consumption, a driver which uses a DML has been attracting attention (refer to Non-Patent Literature 1).

FIG. 9(a) shows electrical-to-optical (EO) response characteristics of a laser diode (LD: Laser Diode) and FIG. 9(b) shows group delay characteristics of the LD. As shown in FIG. 9, since group delay near a relaxation oscillation frequency $f_r$ is increased due to the $f_r$ of the LD, even when in the driver which drives such an LD, a frequency band is improved by employing a simple frequency peaking technique, a problem arises in that the group delay is further increased.

CITATION LIST

Non-Patent Literature

Non-Patent Literature 1: A. Moto, T. Ikagawa, S. Sato, Y. Yamasaki, Y. Onishi, and K. Tanaka, "A low power quad 25.78-Gbit/s 2.5 V laser diode driver using shunt-driving in 0.18 μm SiGe-BiCMOS", Compound Semiconductor Integrated Circuit Symposium, 2013.

SUMMARY

Technical Problem

In order to solve the above-mentioned problem, embodiments of the present invention have been made. An object of the present invention is to provide a DML driver which is capable of improving a band of EO response characteristics while inhibiting group delay near a relaxation oscillation frequency of an LD.

Means for Solving the Problem

A DML driver of embodiments of the present invention includes: a post driver which supplies a driving current to a laser diode; and a pre-driver which drives the post driver in response to an inputted modulated signal, and the pre-driver has: a first transistor to whose gate or base the modulated signal is inputted; a first resistor whose one end is connected to a first power supply voltage; a first inductor whose one end is connected to another end of the first resistor and whose another end is connected to a drain or a collector of the first transistor; a second inductor whose one end is connected the drain or the collector of the first transistor and whose another end is connected to an input terminal of the post driver; a third inductor whose one end is connected to a source or an emitter of the first transistor and whose another end is connected to a second power supply voltage; and a capacitor whose one end is connected to the source or the emitter of the first transistor and whose another end is connected to the second power supply voltage.

In addition, in one configuration example of the DML driver of embodiments of the present invention, the pre-driver further includes a second resistor which is inserted between the source or the emitter of the first transistor and the one end of the third inductor as well as the one end of the capacitor.

In addition, in one configuration example of the DML driver of embodiments of the present invention, the pre-driver further includes a second resistor which is inserted between the source or the emitter of the first transistor and the one end of the third inductor.

In addition, in one configuration example of the DML driver of embodiments of the present invention, the pre-driver further includes a second transistor which is inserted between a connection point of the first and second inductors and the drain or the collector of the first transistor, to whose gate or base a bias voltage is inputted, whose drain or collector is connected to the connection point of the first and second inductors, and whose source or emitter is connected to the drain or the collector of the first transistor.

EFFECTS OF EMBODIMENTS OF THE INVENTION

According to embodiments of the present invention, in a pre-driver, a first transistor is provided with a first resistor, first to third inductors, and a capacitor, whereby a peaking function which improves a band can be added to a DML driver while group delay near a relaxation oscillation frequency of a laser diode is inhibited, and it is made possible to inhibit the group delay near the relaxation oscillation frequency and to further improve a band of EO response characteristics.

DETAILED DESCRIPTION OF ILLUSTRATIVE EMBODIMENTS

First Embodiment

Figure 1:
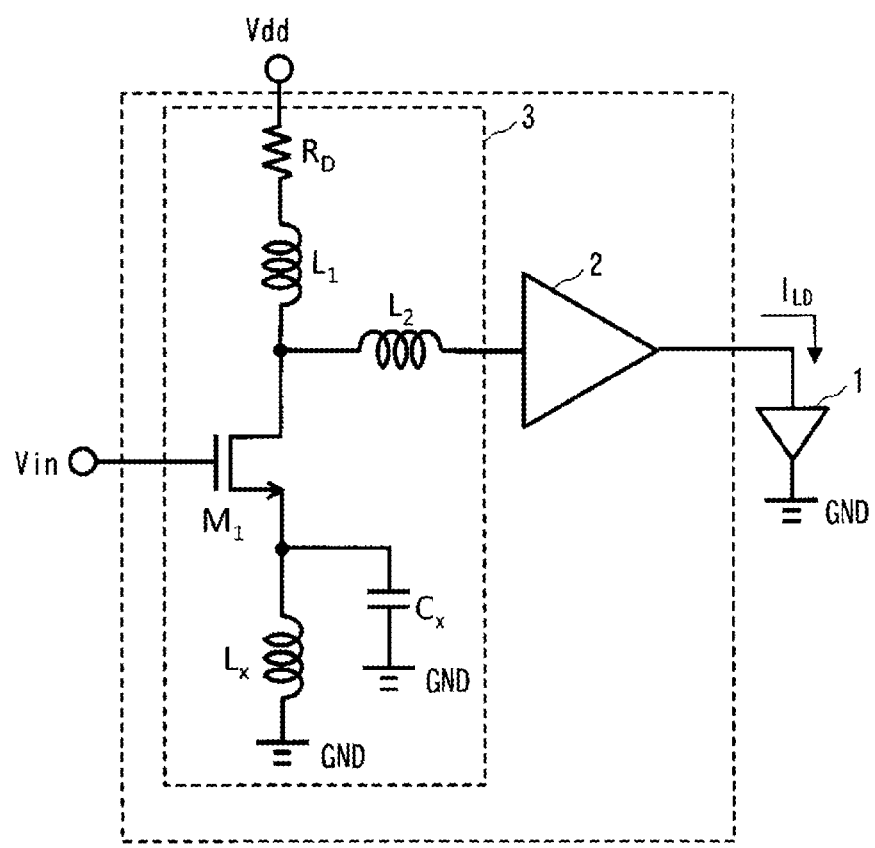
FIG. 1 is a circuit diagram showing a configuration of a DML driver according to a first embodiment of the present invention.

Hereinafter, with reference to the accompanying drawings, embodiments of the present invention will be described. FIG. 1 is a circuit diagram showing a configuration of a DML driver according to a first embodiment of the present invention. The DML driver in the present embodiment includes a post driver 2 which supplies a driving current $I_{LD}$ to an LD 1 and a pre-driver 3 which drives the post driver 2 in response to an inputted modulated signal Vin.

The post driver 2 includes a transistor (not shown) and is a driver capable of driving the LD 1. In embodiments of the present invention, a driver circuit having any configuration is applicable to the post driver 2.

The pre-driver 3 has a peaking function to improve a band while group delay near a relaxation oscillation frequency $f_r$ of the LD 1 is inhibited. Specifically, the pre-driver 3 includes an NMOS transistor $M_1$, a load resistor $R_D$, a peaking inductor $L_1$, a group delay inhibition inductor $L_X$, and a peaking capacitor C. The NMOS transistor $M_1$ is an NMOS to whose gate a modulated signal Vin is inputted. The load resistor $R_D$ is a load resistor whose one end is connected to a power supply voltage Vdd (first power supply voltage). One end of the peaking inductor $L_1$ is connected to another end of the load resistor $R_D$ and another end of the peaking inductor $L_1$ is connected to a drain of the transistor $M_1$. One end of the $L_2$ is connected to the drain of the transistor $M_1$ and another end of the $L_2$ is connected to an input terminal of the post driver 2. One end of the group delay inhibition inductor $L_X$ is connected to a source of the transistor $M_1$ and another end of the group delay inhibition inductor $L_X$ is connected to a ground voltage GND (a second power supply voltage lower than the first power supply voltage). One end of the peaking capacitor $C_X$ is connected to the source of the transistor $M_1$ and another end of the peaking capacitor $C_X$ is connected to a ground voltage GND.

Figure 2:
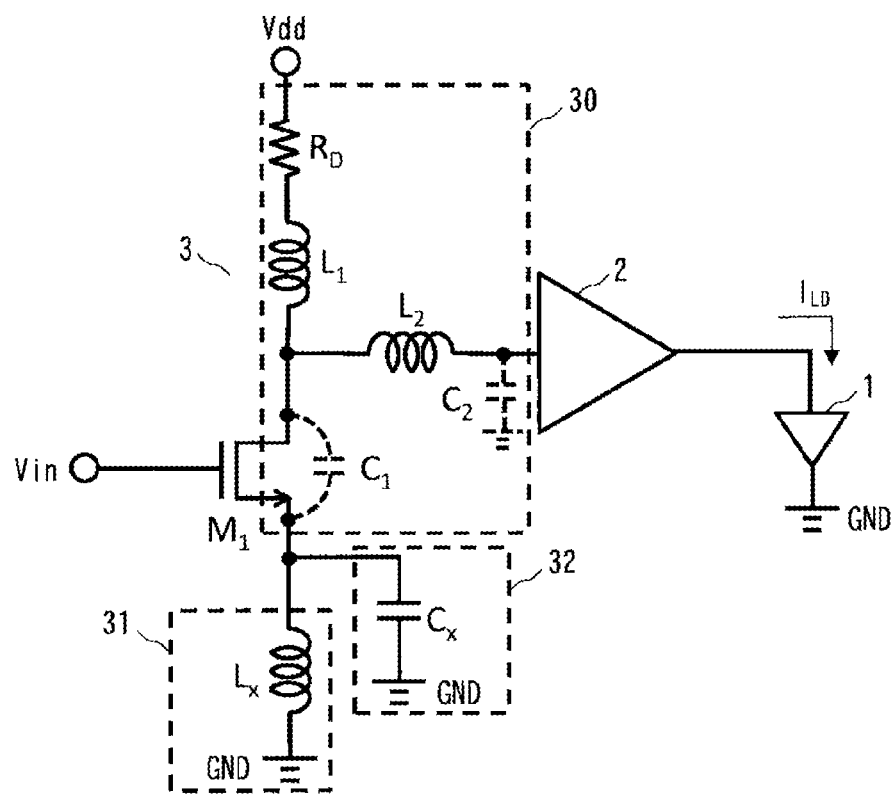
FIG. 2 is a diagram showing parasitic capacitances of a post driver and a pre-driver in FIG. 1.

FIG. 2 is a diagram showing parasitic capacitances of the post driver 2 and the pre-driver 3 shown in FIG. 1. A mark $C_1$ indicates a parasitic capacitance of the transistor $M_1$ and a mark $C_2$ indicates a parasitic capacitance of a transistor (not shown) of an input part of the post driver 2. In a case where the transistor $M_1$ is an FET, the parasitic capacitance $C_1$ is a drain-source parasitic capacitance, and in a case where the transistor $M_1$ is a bipolar transistor, the parasitic capacitance $C_1$ is a collector-emitter parasitic capacitance. In a case where a transconductance of the transistor $M_1$ is defined as $g_m$, a gain $A_v$ of the pre-driver 3 can be represented by the following Expression (1).

Math. 1

$$|A_v(s)| = \frac{C_x s + \frac{1}{L_x s}}{C_2 s + \frac{1}{L_2 s + \frac{1}{C_1 s + \frac{1}{R_D + L_1 s}}}} g_m \quad (1)$$

A mark s in the Expression (1) is a Laplace operator. A part 30 in FIG. 2 which includes the load resistor $R_D$ and the peaking inductors $L_1$ and $L_2$ constitutes a peaking function part. In the peaking function part 30, the larger values of the load resistor $R_D$ and the peaking inductors $L_1$ and $L_2$ are, the larger a peaking amount is. In addition, the smaller the parasitic capacitances $C_1$ and $C_2$ are, the larger the peaking amount is.

A part 31 in FIG. 2 which includes the inductor $L_x$ constitutes a group delay inhibition function part. A peak of a group delay amount near the relaxation oscillation frequency $f_r$ of the LD 1 can be inhibited by the inductor $L_x$.

A part 32 in FIG. 2 which includes the peaking capacitor $C_x$ constitutes a peaking function part in a high band. A decrease in the group delay amount of the $LD_1$ in the high band and a decrease in a group delay amount of the inductor $L_x$ can be inhibited by the peaking capacitor $C_x$.

Figure 3:
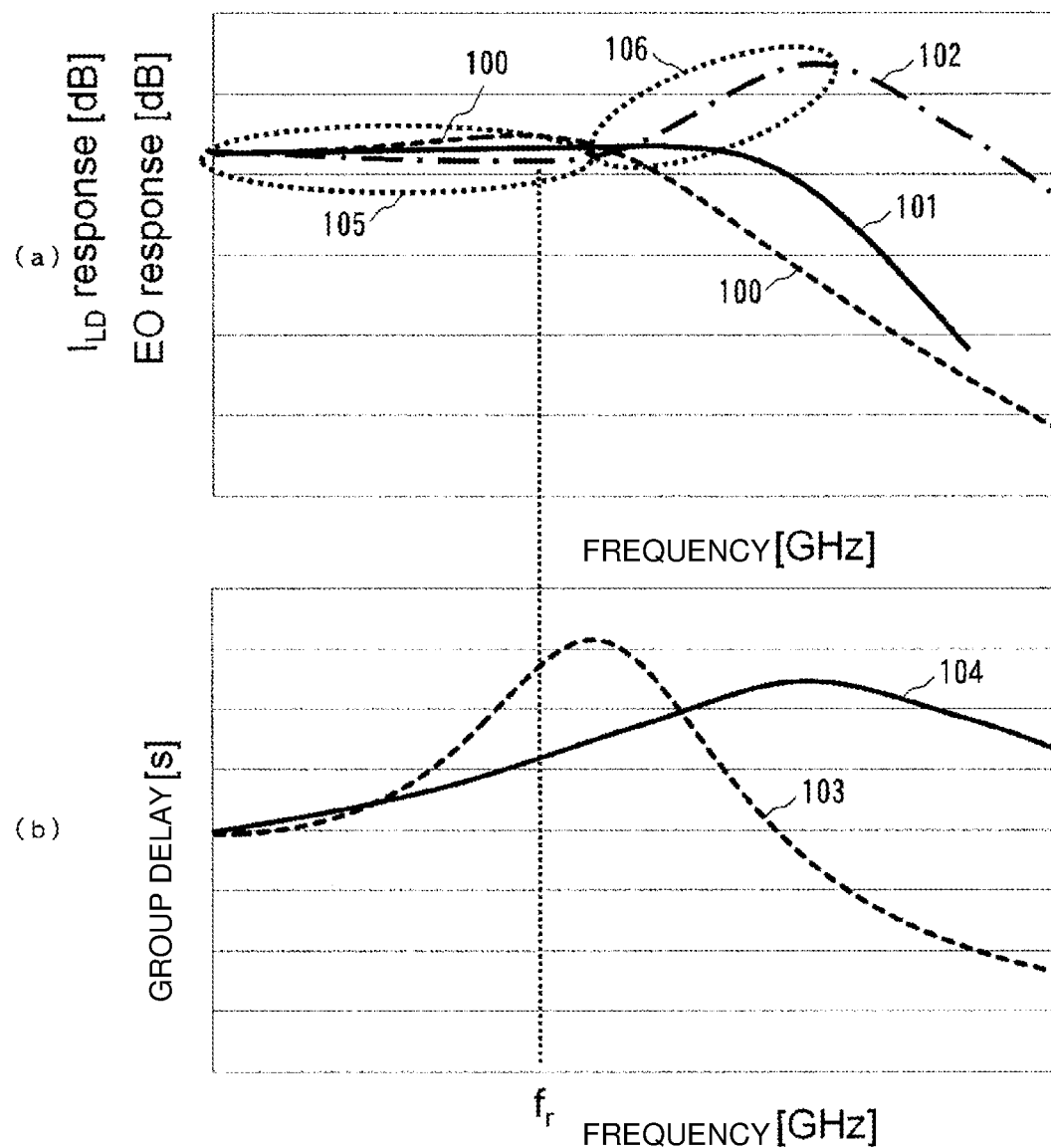
FIG. 3 shows graphs showing ideal characteristics of the first embodiment of the present invention.

FIG. 3 shows graphs showing ideal characteristics of the present embodiment. In FIG. 3(a), 100 shows EO response characteristics of the LD 1 as a single body, 101 shows EO response characteristics of a combination of the DML driver of the present embodiment and the LD 1, and 102 shows response characteristics of an injection current (driving current) $I_{LD}$ to the LD 1. In addition, in FIG. 3(b), 103 shows group delay characteristics of the LD 1 as the single body and 104 shows group delay characteristics of the combination of the DML driver of the present embodiment and the LD 1.

In FIG. 3(a), the response characteristics of the injection current $I_{LD}$ are made up of characteristics in the individual configurations of the peaking function parts 30 and 32 and the group delay inhibition function part 31 shown in FIG. 2. In FIG. 3(a), 105 is a portion where improvement effect by the peaking function part 30 and the group delay inhibition function part 31 is exhibited and 106 is a portion where improvement effect by the peaking function parts 30 and 32 is exhibited.

The group delay inhibition function part 31 performs compensation to deal with a resonant-state peak of the EO response characteristics of the LD 1 as the single body, thereby inhibiting the group delay. In addition, the peaking function parts 30 and 32 have a peaking function by inductance and a peaking function by capacitance, respectively. As shown in FIG. 3, improving a band of the EO response characteristics by the peaking function parts 30 and 32 and the group delay inhibition function part 31 without increasing the resonant-state peak of the EO response characteristics can be expected, and inhibiting the group delay can be expected.

Figure 4:
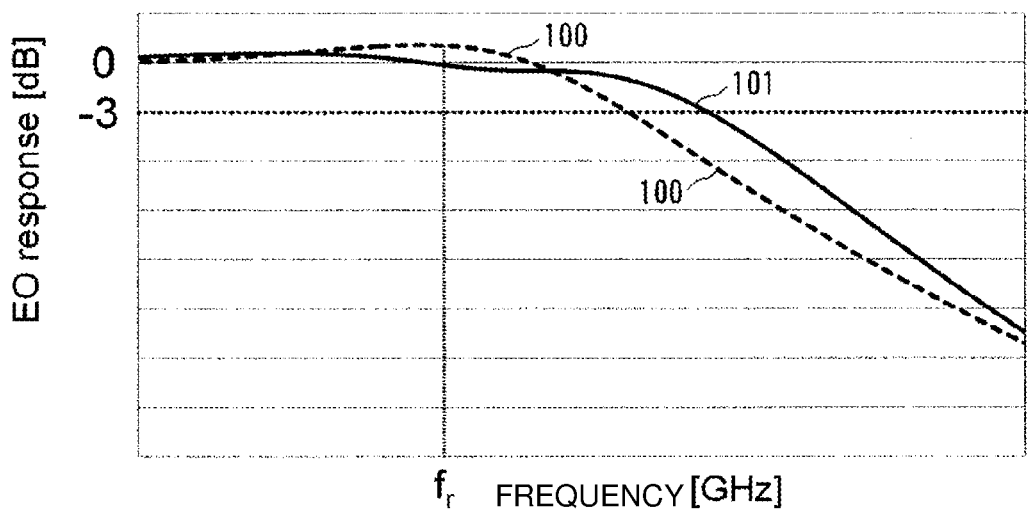
FIG. 4 shows a graph for explaining effect of the DML driver according to the first embodiment of the present invention.

FIG. 4 shows a graph for explaining effect of the present embodiment, the graph showing a simulation result of the EO response characteristics of the LD 1 as the single body and a simulation result of the EO response characteristics of the combination of the DML driver of the present embodiment and the LD 1. As in FIG. 3, 100 shows the EO response characteristics of the LD 1 as the single body and 101 shows the EO response characteristics of the combination of the DML driver of the present embodiment and the LD 1. It is seen from FIG. 4 that although the EO response characteristics shown therein are slightly different from the ideal characteristics shown in FIG. 3(*a*), the band of the EO response characteristics can be improved by using the DML driver of the present embodiment without increasing the resonant-state peak, as compared with the EO response characteristics of the LD 1 as the single body.

Figure 5:
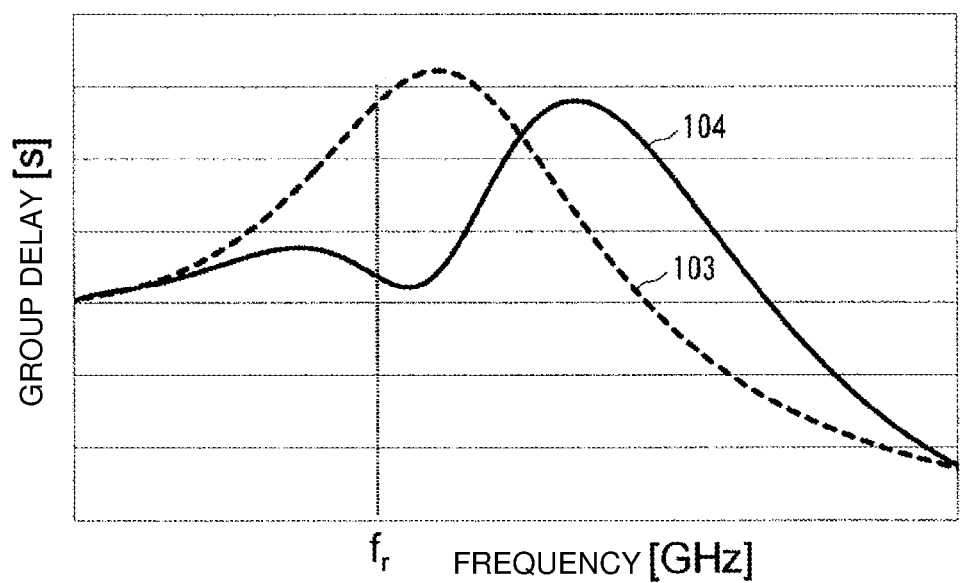
FIG. 5 shows a graph for explaining effect of the DML driver according to the first embodiment of the present invention.

FIG. 5 shows a graph for explaining effect of the present embodiment, the graph showing a simulation result of the group delay characteristics of the LD 1 as the single body and a simulation result of the group delay characteristics of the combination of the DML driver of the present embodiment and the LD 1. As in FIG. 3, 103 shows the group delay characteristics of the LD 1 as the single body and 104 shows the group delay characteristics of the combination of the DML driver of the present embodiment and the LD 1. It is seen from FIG. 5 that although the group delay characteristics shown therein are slightly different from the ideal characteristics shown in FIG. 3(*b*), a peak of a group delay amount near the relaxation oscillation frequency $f_r$ of the LD 1 can be inhibited by using the DML driver of embodiments of the present invention with respect to the group delay characteristics of the LD 1 as the single body and a maximum value of a group delay amount also as to the whole frequency band can be reduced.

Second Embodiment

Figure 6:
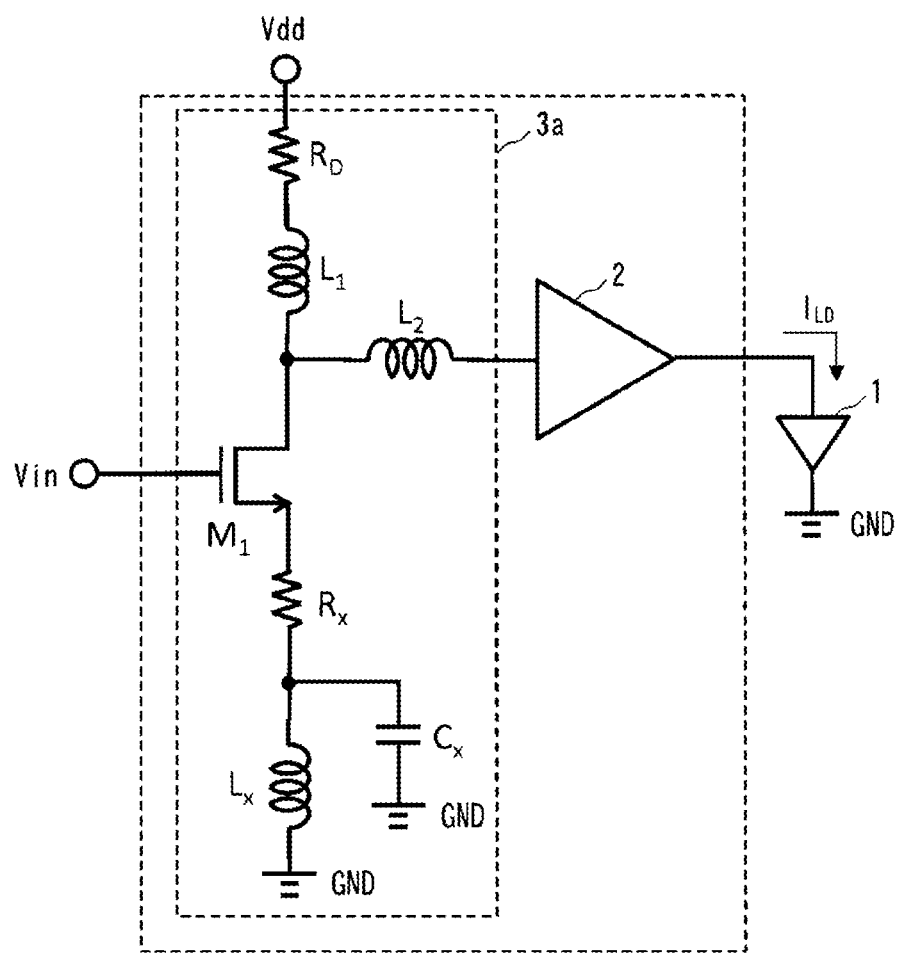
FIG. 6 is a circuit diagram showing a configuration of a DML driver according to a second embodiment of the present invention.

Next, a second embodiment of the present invention will be described. FIG. 6 is a circuit diagram showing a configuration of a DML driver according to the second embodiment of the present invention, and in FIG. 6, the same components as those in FIG. 1 are denoted by the same reference signs. The DML driver of the present embodiment includes a post driver 2 and a pre-driver 3*a*.

In the pre-driver 3*a* of the present embodiment, a resistor $R_x$ is inserted between the source of the transistor $M_1$ of the pre-driver 3 of the first embodiment and one end of the inductor $L_x$ of the pre-driver 3 thereof as well as one end of the capacitor $C_x$ of the pre-driver 3 thereof. In this way, in the present embodiment, a linearization function can be added to the pre-driver 3*a*. In a case where the post driver 2 also has the linearization function, even when a signal Vin inputted to the pre-driver 3*a* is a signal, such as a four level pulse amplitude modulation (PAM4) signal and a discrete multitone (DMT) signal, for which linearity is required, it is made possible to drive an LD 1.

Third Embodiment

Figure 7:
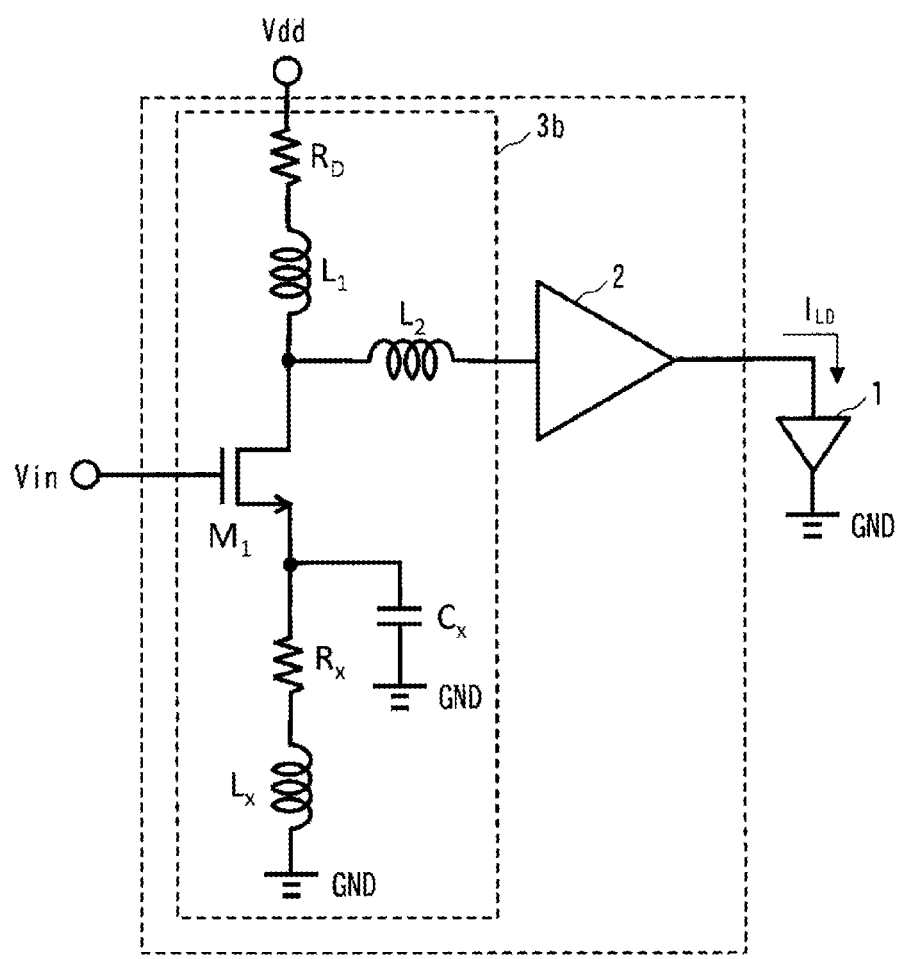
FIG. 7 is a circuit diagram showing a configuration of a DML driver according to a third embodiment of the present invention.

Next, a third embodiment of the present invention will be described. FIG. 7 is a circuit diagram showing a configuration of a DML driver according to the third embodiment of the present invention, and in FIG. 7, the same components as those in FIG. 1 are denoted by the same reference signs. The DML driver of the present embodiment includes a post driver 2 and a pre-driver 3*b*.

In the pre-driver 3*b* of the present embodiment, a resistor $R_x$ is inserted between the source of the transistor $M_1$ of the pre-driver 3 of the first embodiment and one end of the inductor $L_x$ of the pre-driver 3 thereof. In the present embodiment, as compared with the configuration of the second embodiment, impedance added to the source of the transistor $M_1$ can be lowered in a high band and a gain of the driver can be increased, thereby enabling a frequency band to be improved.

Fourth Embodiment

Figure 8:
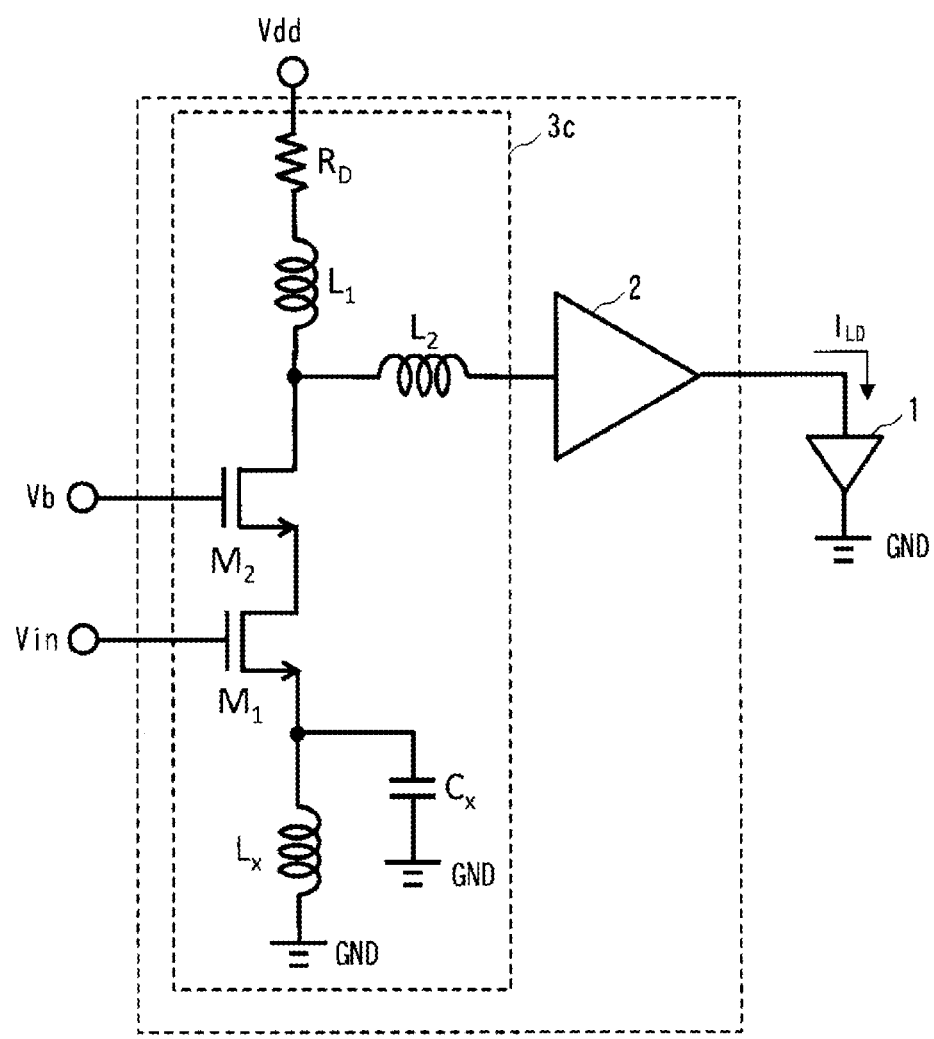
FIG. 8 is a circuit diagram showing a configuration of a DML driver according to a fourth embodiment of the present invention.
Figure 9:
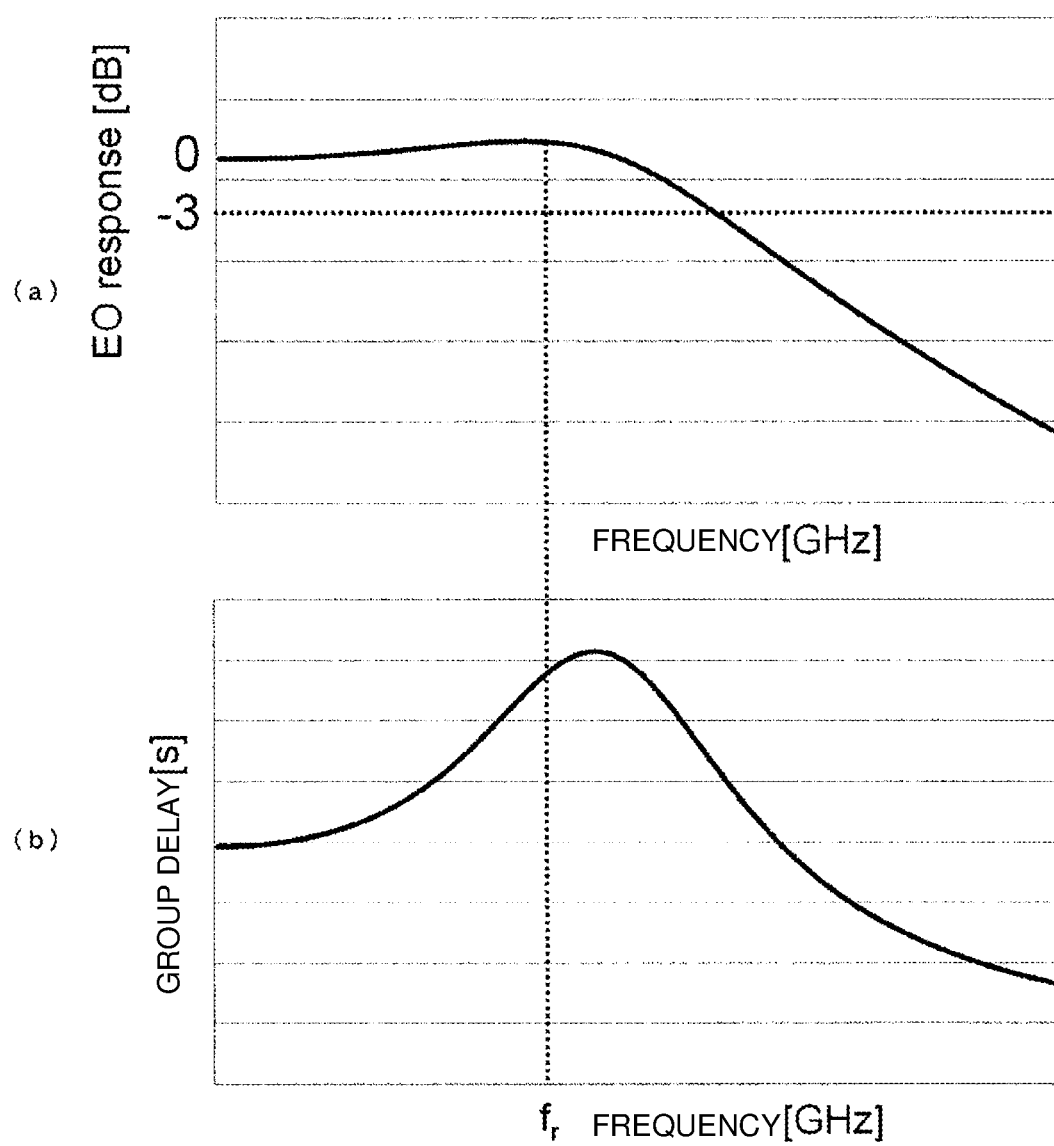
FIG. 9 shows graphs showing EO response characteristics and group delay characteristics of an LD.

Next, a fourth embodiment of the present invention will be described. FIG. 8 is a circuit diagram showing a configuration of a DML driver according to the fourth embodiment of the present invention, and in FIG. 8, the same components as those in FIG. 1 are denoted by the same reference signs. The DML driver of the present embodiment includes a post driver 2 and a pre-driver 3*c*.

In the pre-driver 3*c* of the present embodiment, an NMOS transistor $M_2$, to whose gate a DC bias voltage Vb is inputted, whose drain is connected to a connection point of inductors $L_1$ and $L_2$, and whose source is connected to the drain of the transistor $M_1$, is inserted to the pre-driver 3 of the first embodiment. It is desirable that the bias voltage Vb is set in such a way that the transistors $M_1$ and $M_2$ operate in a saturated region.

Since in the present embodiment, by connecting the transistors $M_1$ and $M_2$ in a cascode manner, mirror effect in the transistor $M_1$ can be inhibited, frequency characteristics of the DML driver can be further improved.

Note that although in the first to fourth embodiments, the example in which the FET is used as each of the transistors $M_1$ and $M_2$ is shown, a bipolar transistor may be used. In a case where the bipolar transistor is used, in the above description, it is only required for the gate to be replaced with a base, for the drain to be replaced with a collector, and for the source to be replaced with an emitter.

INDUSTRIAL APPLICABILITY

Embodiments of the present invention are applicable to technology which directly modulates optical output of a laser diode.

REFERENCE SIGNS LIST

1 Laser diode
2 Post driver
3, 3*a*, 3*b*, 3*c* Pre-driver
$M_1$, $M_2$ Transistor
$R_D$, $R_x$ Resistor
$L_1$, $L_2$, $L_x$ Inductor
$C_x$ Capacitor
30, 32 Peaking function part
31 Group delay inhibition function part.

The invention claimed is:

1. A DML driver comprising:
a post driver configured to supply a driving current to a laser diode; and
a pre-driver configured to drive the post driver in response to an inputted modulated signal, the pre-driver including:
a first transistor, wherein the inputted modulated signal is configured to be input into a gate of the first transistor or a base of the first transistor;
a first resistor, wherein a first end of the first resistor is connected to a first power supply voltage;
a first inductor, wherein a first end of the first inductor is connected to a second end of the first resistor, wherein a second end of the first inductor is connected to a drain of the first transistor or a collector of the first transistor;
a second inductor, wherein a first end of the second inductor is connected to the drain of the first transistor or the collector of the first transistor, wherein a second end of the second inductor is connected to an input terminal of the post driver;

a third inductor, wherein a first end of the third inductor is connected to a source of the first transistor or an emitter of the first transistor, wherein a second end of the third inductor is connected to a second power supply voltage; and a capacitor, wherein a first end of the capacitor is connected to the source of the first transistor or the emitter of the first transistor, wherein a second end of the capacitor is connected to the second power supply voltage.

2. The DML driver according to claim 1, wherein the pre-driver further includes a second resistor between the source of the first transistor or the emitter of the first transistor and the first end of the third inductor as well as the first end of the capacitor.

3. The DML driver according to claim 1, wherein the pre-driver further includes a second resistor between the source of the first transistor and the second end of the third inductor or between the emitter of the first transistor and the second end of the third inductor.

4. The DML driver according to claim 1, wherein the pre-driver further includes a second transistor between a connection point and the drain of the first transistor or between the connection point and the collector of the first transistor, wherein the connection point is of the first inductor and the second inductor, wherein a bias voltage is configured to be input to the a gate of the second transistor or a base of the second transistor, wherein a drain of the second transistor or a collector of the second transistor is connected to the connection point, and wherein a source of the second transistor or an emitter of the second transistor is connected to the drain of the first transistor or the collector of the first transistor.

5. A method comprising:

supplying, by a post driver of a DML driver, a driving current to a laser diode; and driving, by a pre-driver of the DML driver, the post driver in response to an inputted modulated signal, the pre-driver including:

a first transistor, wherein the inputted modulated signal is input into a gate of the first transistor or a base of the first transistor;

a first resistor, wherein a first end of the first resistor is connected to a first power supply voltage;

a first inductor, wherein a first end of the first inductor is connected to a second end of the first resistor, wherein a second end of the first inductor is connected to a drain of the first transistor or a collector of the first transistor;

a second inductor, wherein a first end of the second inductor is connected to the drain of the first transistor or the collector of the first transistor, wherein a second end of the second inductor is connected to an input terminal of the post driver;

a third inductor, wherein a first end of the third inductor is connected to a source of the first transistor or an emitter of the first transistor, wherein a second end of the third inductor is connected to a second power supply voltage; and a capacitor, wherein a first end of the capacitor is connected to the source of the first transistor or the emitter of the first transistor, wherein a second end of the capacitor is connected to the second power supply voltage.

6. The method according to claim 5, wherein the pre-driver further includes a second resistor between the source of the first transistor or the emitter of the first transistor and the first end of the third inductor as well as the first end of the capacitor.

7. The method according to claim 5, wherein the pre-driver further includes a second resistor between the source of the first transistor and the second end of the third inductor or between the emitter of the first transistor and the second end of the third inductor.

8. The method according to claim 5, wherein the pre-driver further includes a second transistor between a connection point and the drain of the first transistor or between the connection point and the collector of the first transistor, wherein the connection point is of the first inductor and the second inductor, wherein a bias voltage is configured to be input to the a gate of the second transistor or a base of the second transistor, wherein a drain of the second transistor or a collector of the second transistor is connected to the connection point, and wherein a source of the second transistor or an emitter of the second transistor is connected to the drain of the first transistor or the collector of the first transistor.

* * * * *